United States Patent
Ohkido

(10) Patent No.: US 10,734,986 B2
(45) Date of Patent: Aug. 4, 2020

(54) RECEIVING CIRCUIT, TRANSMISSION CIRCUIT AND SYSTEM

(71) Applicant: RENESAS ELECTRONICS CORPORATION, Tokyo (JP)

(72) Inventor: Toshio Ohkido, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/154,493

(22) Filed: Oct. 8, 2018

(65) Prior Publication Data
US 2019/0190508 A1    Jun. 20, 2019

(30) Foreign Application Priority Data

Dec. 15, 2017 (JP) ................................ 2017-240489

(51) Int. Cl.
| | |
|---|---|
| H03K 9/08 | (2006.01) |
| H03K 7/08 | (2006.01) |
| G05F 3/02 | (2006.01) |
| H04B 3/04 | (2006.01) |
| H03K 3/017 | (2006.01) |

(Continued)

(52) U.S. Cl.
CPC ........... *H03K 9/08* (2013.01); *G01R 29/0273* (2013.01); *G05F 3/02* (2013.01); *H03K 3/017* (2013.01); *H03K 5/1252* (2013.01); *H03K 5/19* (2013.01); *H03K 5/26* (2013.01); *H03K 7/08* (2013.01); *H04B 1/1027* (2013.01); *H04B 3/04* (2013.01); *H04L 27/14* (2013.01); *H04L 27/156* (2013.01); *H04L 27/1563* (2013.01)

(58) Field of Classification Search
CPC ............ H03K 9/08; H03K 9/06; H03K 3/017; H03K 3/013; H03K 5/1252; H03K 5/19; H04L 27/14; H04L 27/156; H04L 27/1563; H04B 5/0031; H04B 1/1027; G01R 29/0273; H03M 1/0626
See application file for complete search history.

(56) References Cited

U.S. PATENT DOCUMENTS

| | | | | |
|---|---|---|---|---|
| 5,303,415 A | * | 4/1994 | Takayama | ............ H04B 1/1027 455/234.1 |
| 6,337,649 B1 | * | 1/2002 | Becker | ................. H03K 5/1252 327/34 |

(Continued)

FOREIGN PATENT DOCUMENTS

JP            06-37822 A       2/1994

*Primary Examiner* — Ryan Johnson
(74) *Attorney, Agent, or Firm* — McDermott Will & Emery LLP

(57) ABSTRACT

A receiving circuit, a transmission circuit and a system capable of reducing the effect of noise are provided. The receiving circuit includes: a pulse width detection unit which determines whether or not the pulse width of a pulse signal outputted based on comparison between a received-signal voltage and a reference voltage is smaller than a predetermined width; a reference voltage setting unit which, when the pulse width is smaller than the predetermined width, sets the reference voltage to be equal to or higher than a predetermined voltage; and an output control unit which, when the pulse width is equal to or larger than the predetermined width, causes a digital signal based on the pulse signal to be outputted or, when the pulse width is smaller than the predetermined width, performs control not to output the digital signal.

13 Claims, 5 Drawing Sheets

(51) Int. Cl.
  *H03K 5/26* (2006.01)
  *H03K 5/19* (2006.01)
  *H04L 27/14* (2006.01)
  *G01R 29/027* (2006.01)
  *H04L 27/156* (2006.01)
  *H03K 5/1252* (2006.01)
  *H04B 1/10* (2006.01)

(56) References Cited

U.S. PATENT DOCUMENTS 7,733,995 B2 * 6/2010 Usui .................... H03K 5/1252
　　　　　　　　　　　　　　　　　　　　370/290
7,772,921 B2 * 8/2010 Hung ................ H03K 3/02337
　　　　　　　　　　　　　　　　　　　　327/34

* cited by examiner

RECEIVING CIRCUIT, TRANSMISSION CIRCUIT AND SYSTEM

CROSS-REFERENCE TO RELATED APPLICATIONS

The disclosure of Japanese Patent Application No. 2017-240489 filed on Dec. 15, 2017 including the specification, drawings and abstract is incorporated herein by reference in its entirety.

BACKGROUND

This disclosure relates to a receiving circuit, a transmission circuit and a system and, more particularly, to a receiving circuit, a transmission circuit and a system which can reduce the effect of noise.

An FSK receiving circuit which demodulates a signal modulated by FSK (Frequency Shift Keying) includes a detector which detects a received signal and a voltage comparison unit which outputs a digital signal based on the voltage of the received signal after detection and a reference voltage.

In Japanese Unexamined Patent Application Publication No. Hei 6(1994)-37822, it is disclosed that: an FSK signal detected by a detector is branched; one of the voltages resulting from branching is inputted to a voltage comparison unit; from the other of the voltages resulting from branching, a dc voltage component is extracted and the extracted dc voltage component is inputted to a reference voltage generation unit; and, at the reference voltage generation unit, a reference voltage is generated from the dc voltage component and the generated reference voltage is inputted to the voltage comparison unit. Also, according to Japanese Unexamined Patent Application Publication No. Hei 6(1994)-37822, the variation of the dc voltage inputted to the voltage comparison unit and the variation of the dc voltage outputted from the reference voltage generation unit become equal, so that the voltage comparison unit can generate, out of the output from the detector, a digital signal with an accurate data bit width.

SUMMARY

However, the detector included in the FSK receiving circuit outputs random noise even when there is no received signal (in a no-signal state). This causes a problem that, even when there is no received signal, the voltage comparison unit outputs a digital signal based on random noise and a reference voltage.

Other objects and novel features of the present invention will become apparent from the description of this specification and the accompanying drawings.

According to one embodiment of the present invention, a receiving circuit includes: a voltage comparison unit which compares the voltage of a received signal after detection and a reference voltage and outputs a pulse signal; a reference voltage setting unit which, when the pulse width of the pulse signal is smaller than a predetermined width, sets the reference voltage to be equal to or higher than the predetermined voltage and, when the pulse width of the pulse signal is equal to or larger than the predetermined width, sets the reference voltage to be lower than the predetermined voltage; and an output control unit which, when the pulse width is smaller than the predetermined width, does not output the pulse signal and, when the pulse width is equal to or larger than the predetermined width, outputs the pulse signal.

According to the above embodiment, a receiving circuit, a transmission circuit and a system which can reduce the effect of noise can be provided.

DETAILED DESCRIPTION

Figure 1:
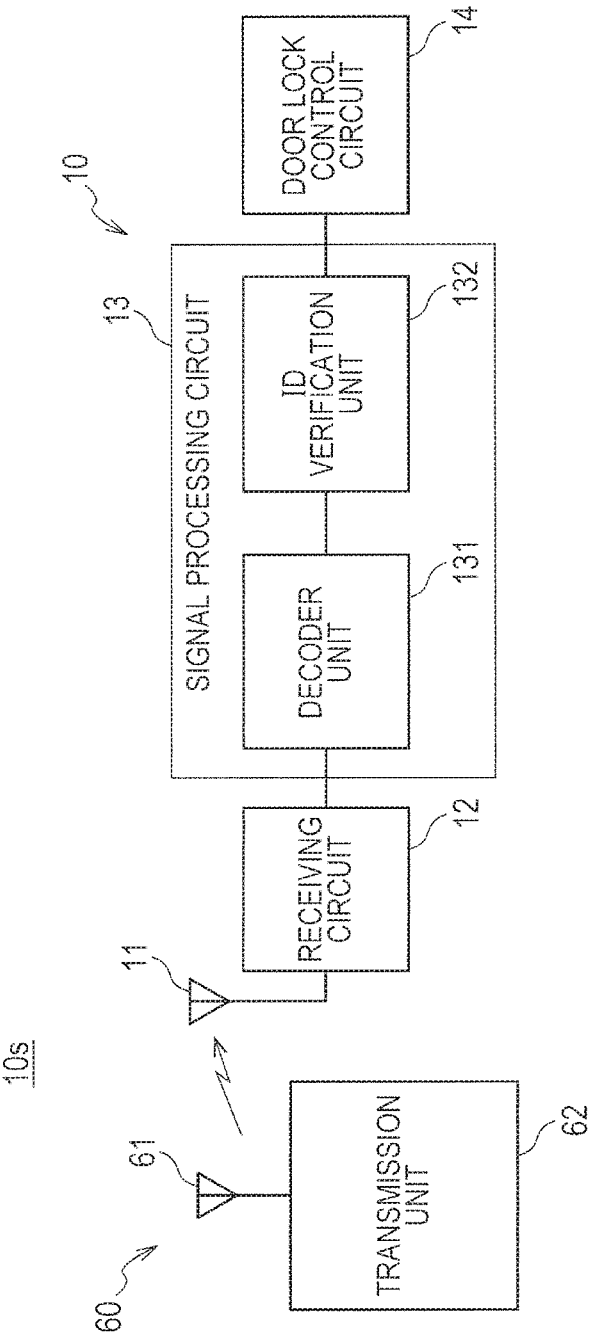
FIG. 1 is a block diagram illustrating an example system according to a first embodiment of the present invention.

The following description and the drawings referred to in the following include omissions and simplification as appropriate to make description clear. Also, elements represented in drawings as function blocks to perform various processing can be realized hardware-wise with a CPU, a memory and other circuits or software-wise with, for example, programs loaded in memory. Therefore, it will be understood by those skilled in the art that such function blocks can be realized in various ways, for example, by hardware means only or by software means only or by combining hardware means and software means without being limited to any particular means. Also, in the drawings referred to in the following, identical elements are denoted by identical numerals and symbols and, in the description, descriptive duplication is avoided as appropriate.

The programs mentioned above can be stored using various types of non-transitory computer-readable media and can be supplied to a computer. Non-transitory computer-readable media include various types of tangible storage media and may be, for example, magnetic recording media (e.g., flexible disks, magnetic tapes and hard disk drives), magneto-optical media (e.g., magneto-optical disks), CD-ROMs (Read Only Memories), CD-Rs, CD-R/Ws, semiconductor memories (e.g., mask ROMs, PROMs (Programmable ROMs), EPROMs (Erasable PROMs), flash ROMs, and RAMs (Random Access Memories). The programs may be supplied to a computer using various types of transitory computer-readable media. The transitory computer-readable media include, for example, electric signals, optical signals, and electromagnetic waves. The transitory computer-readable media can be used to supply programs to a computer via wired communication channels such as electric wires and optical fibers or via radio channels.

First Embodiment

A whole system will be described.

FIG. 1 is a block diagram illustrating an example system according to a first embodiment of the present invention.

As shown in FIG. 1, a system 10s of the first embodiment includes a receiving device 10 which includes a receiving circuit 12 and a terminal device 60 which communicates with the receiving device 10.

The terminal device 60 includes an antenna 61 and a transmission unit 62. The terminal device 60 communicates with the receiving device 10 via the antenna 61. The transmission unit 62 remotely operates the receiving device 10.

The receiving device 10 includes an antenna 11, a signal processing circuit 13 and a door lock control circuit 14. The receiving device 10 receives, via the antenna 11, signals transmitted from the terminal device 60. The receiving circuit 12 demodulates the received signals and outputs digital signals Ds generated by demodulation to the signal processing circuit 13. The signals received by the receiving circuit 12 will be referred to as "received signals Rs."

The signal processing circuit 13 includes a decoder unit 131 which decodes digital signals Ds inputted from the receiving circuit 12 and an ID verification unit 132 which verifies signal ID (identification). When there is no received signal Rs or when no digital signal Ds is inputted from the receiving circuit 12 (when no digital signal Ds is outputted from the receiving circuit 12), the signal processing circuit 13 enters a power-down state to reduce power consumption. When, in a power-down state, a digital signal Ds is received from the receiving circuit 12, the signal processing circuit 13 is activated, exiting the power-down state, then decodes the digital signal Ds and verifies the signal ID.

The terminal device 60 is, for example, a remote control device for releasing a vehicle door lock. A signal transmitted from the remote control device is received by the receiving device 10 mounted on a vehicle. The ID verification unit 132 included in the receiving device 10 verifies the ID. When the ID is successfully verified by the ID verification unit 132, the door-lock control circuit 14 releases the door-lock of the vehicle.

The system 10s may also be referred to as a remote entry system.

The receiving circuit 12 will be described below.

Figure 2:
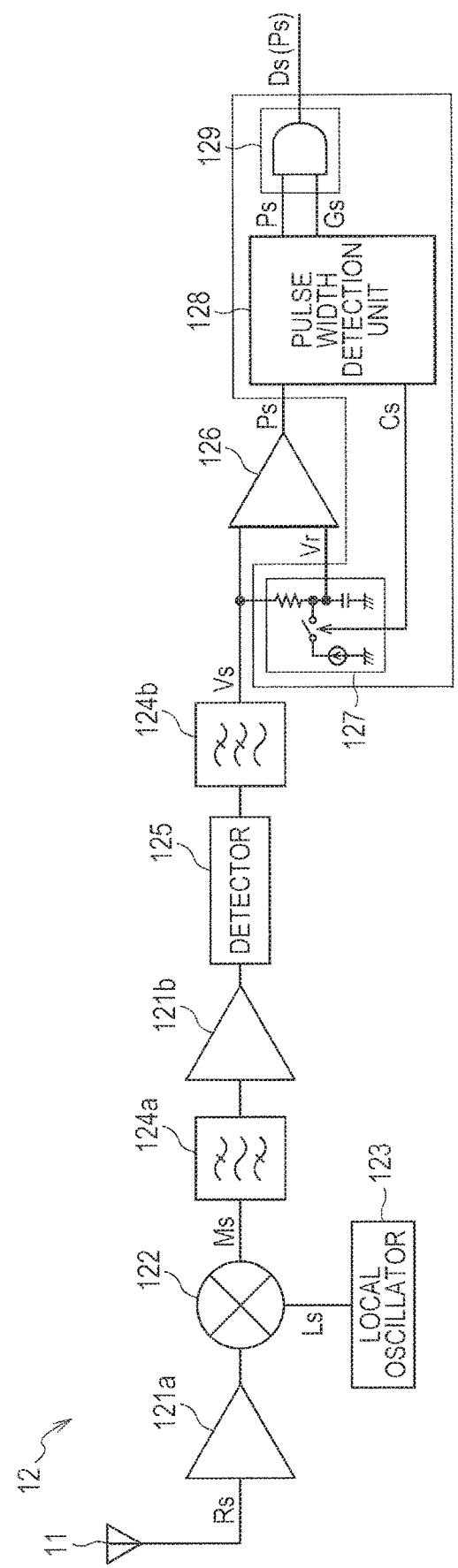
FIG. 2 is a block diagram illustrating a receiving circuit of the first embodiment.

FIG. 2 is a block diagram illustrating the receiving circuit 12 of the first embodiment.

As shown in FIG. 2, the receiving circuit 12 includes a low-noise amplifier unit 121a, a mixer 122, a local oscillator 123, a band-pass filter 124a, an intermediate frequency amplifier unit 121b, a detector 125, a low-pass filter 124b, a voltage comparison unit 126, a reference voltage setting unit 127, a pulse-width detection unit 128 and an output control unit 129.

The low-noise amplifier unit 121a amplifies a received signal Rs received via the antenna 11. The received signal Rs is, for example, an FSK (frequency shift keying) modulated signal. The local oscillator 123 outputs a local oscillation signal Ls. The mixer 122 converts, using the local oscillation signal Ls, the received signal Rs into an intermediate-frequency signal Ms. The band-pass filter 124a removes unnecessary components of the intermediate-frequency signal Ms.

The intermediate-frequency amplifier unit 121b amplifies the intermediate-frequency signal Ms coming through the band-pass filter 124a. The detector 125 detects (demodulates) the intermediate-frequency signal Ms, thereby, converting the signal into a voltage Vs. Namely, the received signal Rs is, after being converted into the intermediate-frequency signal Ms, converted into a voltage Vs using the detector 125. The received signal Rs may be directly converted into the voltage Vs by using the detector 125. The low-pass filter 124b removes unnecessary high-frequency components of the voltage Vs. The voltage Vs coming through the low-pass filter 124b is referred to as "the voltage Vs of the received signal Rs."

The voltage comparison unit 126 compares the voltage Vs of the received signal Rs after detection and a reference voltage Vr, then outputs a pulse signal Ps. Namely, the voltage comparison unit 126, by comparing the voltage Vs of the received signal Rs and the reference voltage Vr, shapes the waveform of the received signal Rs and outputs the shaped pulse signal Ps.

To be specific, when the voltage Vs of the received signal Rs is equal to or higher than the reference voltage Vr, the voltage comparison unit 126 outputs a high pulse signal Ps. Also, when the voltage Vs of the received signal Rs is lower than the reference voltage Vr, the voltage comparison unit 126 outputs a low pulse signal Ps.

The high pulse signal is a pulse signal with a voltage equal to or higher than a predetermined threshold voltage. The low pulse signal is a pulse signal with a voltage lower than the predetermined threshold voltage.

The pulse width detection unit 128 determines whether the pulse width of the pulse signal Ps outputted from the voltage comparison unit 126 is smaller than a predetermined pulse width Wh.

When the pulse width Pw is smaller than the predetermined pulse width Wh, the reference voltage setting unit 127 sets the reference voltage Vr to a predetermined voltage Vh or higher. Also, when the pulse width Pw is equal to or larger than the predetermined width Wh, the reference voltage setting unit 127 sets the reference voltage Vr to be lower than the predetermined voltage Vh.

When the pulse width Pw is smaller than the predetermined pulse width Wh, the output control unit 129 does not output the pulse signal Ps. When the pulse width Pw is equal to or larger than the predetermined width Wh, the output control unit 129 outputs the shaped pulse signal Ps as a digital signal Ds.

The signals used in communication are subject to, for example, a radio communication standard. In the case of the receiving device (receiving circuit 12) of the first embodiment, too, specifications of the received signal Rs are subject to the radio communication standard to be applied. A received signal Rs complying with, for example, a radio communication standard will be referred to as a standard received signal Rss. When a standard received signal Rss is inputted to the detector 125, the voltage outputted from the detector 125 and then inputted to the voltage comparison unit 126 via the low-pass filter 124b is referred to as the voltage Vss of the standard received signal Rss. When noise is inputted to the detector 125, the voltage outputted from the detector 125 and then inputted to the voltage comparison unit 126 via the low-pass filter 124b is referred to as noise voltage Vz.

When voltages Vss of standard received signals Rss are inputted to the voltage comparison unit 126, the pulse widths Pw of the pulse signals Ps outputted from the voltage comparison unit 126 widely vary. However, the minimum pulse width set for the pulse signals Ps outputted from the voltage comparison unit 126 is fixed and is referred to as a minimum pulse width Pwm.

When voltages Vss of standard received signals Rss are inputted to the voltage comparison unit 126, pulse signals Ps with pulse widths Pw smaller than the minimum pulse width Pwm are not outputted from the voltage comparison unit 126. Pulse signals Ps with pulse widths equal to or larger than the minimum pulse width Pwm are outputted from the voltage comparison unit 126.

However, when noise voltage Vz is inputted to the voltage comparison unit 126, there are cases in which pulse signals Ps with pulse widths smaller than the minimum pulse width Pwm are outputted from the voltage comparison unit 126. Such pulse signals Ps with pulse widths Pw smaller than the minimum pulse width Pwm are each referred to as a pulse signal Psm. There are cases in which pulse signals Psm outputted from the voltage comparison unit 126 cause the signal processing circuit 13 to make errors.

In the first embodiment, the predetermined width Wh is applied as the minimum pulse width Pwm of the voltage Vss of each standard received signal Rss. With the predetermined width applied as the minimum pulse width Pwm, the output control unit 129 does not output pulse signals Ps with pulse widths smaller than the minimum pulse width Pwm.

In this way, when noise is inputted to the receiving circuit 12, the output control unit 129 of the receiving circuit 12 does not output pulse signals Ps as digital signals Ds, so that the effect of noise is reduced.

Namely, since the effect of noise different from the required received signals is eliminated, unnecessary operation is inhibited and power consumption is reduced.

The reference voltage setting unit 127, the pulse width detection unit 128 and the output control unit 129 included in the receiving circuit 12 each have a function for not being affected by noise (a noise removal function). Hence, the reference voltage setting unit 127, the pulse width detection unit 128 and the output control unit 129 are sometimes generically referred to as a noise filter.

When the pulse width Pw of a pulse signal Ps outputted from the voltage comparison unit 126 is smaller than the predetermined width Wh, the receiving circuit 12 sets the receiving device 10 that includes the receiving circuit 12 into an inactive state. Alternatively, when the pulse width Pw of the pulse signal Ps is smaller than the predetermined width Wh, the receiving circuit 12 may set, for example, the signal processing circuit 13 included in the receiving device 10 into an inactive state. The inactive state may also be referred to as a "power-down state."

By setting a part or a whole of the receiving device 10 into an inactive state, the power consumption of the receiving device 10 can be reduced.

When, with the receiving device 10 in an inactive state, the pulse width Pw of a pulse signal Ps outputted from the voltage comparison unit 126 is found equal to or larger than the predetermined width Wh, the receiving circuit 12 sets the receiving device 10 in the inactive state into an active state.

In this way, the receiving device 10 in a power-down state can be immediately activated.

When the pulse width Pw of a pulse signal Ps outputted after the voltage Vs of a received signal Rs and the reference voltage Vr are compared is smaller than the predetermined width Wh, the pulse width detection unit 128 outputs a control signal Cs. When the pulse width Pw is equal to or larger than the predetermined width Wh, the pulse width detection unit 128 outputs no control signal Cs.

Also, when a control signal Cs is inputted, the reference voltage setting unit 127 sets the reference voltage Vr to be equal to or higher than the predetermined voltage Vh. When no control signal Cs is inputted, the reference voltage setting unit 127 sets the reference voltage Vr to be lower than the predetermined voltage Vh.

The output control unit 129 outputs no pulse signal Ps when a control signal Cs is inputted and outputs a pulse signal Ps when no control signal Cs is inputted.

In the receiving circuit 12 of the first embodiment, when pulse signals Ps with pulse widths Pw smaller than the minimum pulse width Pwm set for the standard received signals Rss are outputted from the voltage comparison unit 126, the reference voltage setting unit 127 raises the reference voltage Vr supplied to the voltage comparison unit 126. Raising the reference voltage Vr inhibits output from the voltage comparison unit 126 of pulse signals Ps corresponding to noise in a signal-less state without any standard received signal Rss.

Also, while pulse signals Ps with pulse widths Pw smaller than the minimum pulse width Pwm set for the standard received signals Rss are outputted from the voltage comparison unit 126, the output control unit 129 does not output the pulse signals Psm as digital signals Ds.

In this way, when noise is inputted to the receiving circuit 12 while no signal is received, the output control unit 129 included in the receiving circuit 12 outputs no output digital signals Ds, so that the effect of the noise is reduced.

Thus, a receiving circuit and a system which can reduce the effect of noise can be provided.

Also, when the pulse width Pw of a pulse signal Ps outputted from the voltage comparison unit 126 is smaller than the predetermined width Wh, unnecessary operation caused by noise is stopped, so that, for example, the signal processing circuit 13 included in the receiving device 10 is set in an inactive state. With the signal processing circuit 13 set in an inactive state, circuit operation of the receiving device 10 is optimized and the power consumption of the receiving device 10 can be reduced.

A concrete example of the reference voltage setting unit 127 will be described in the following.

Figure 3:
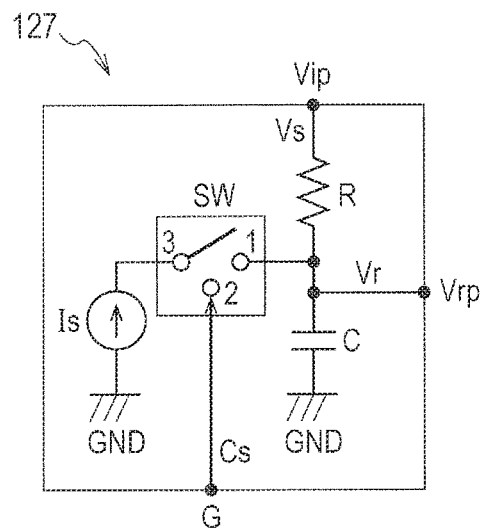
FIG. 3 is a circuit diagram illustrating a reference voltage setting unit of the first embodiment.

FIG. 3 is a circuit diagram illustrating the reference voltage setting unit 127 of the first embodiment.

As shown in FIG. 3, the reference voltage setting unit 127 of the first embodiment includes a resistive element R, a capacitive element C, a switch Sw, a constant-current source Is, a received signal voltage terminal Vip, a control signal terminal G and a reference voltage terminal Vrp.

The resistive element R is coupled at one end to voltage Vs of the received signal Rs via the received signal voltage terminal Vip and, at the other end, to the reference voltage Vr via the reference voltage terminal Vrp. The capacitive element C is coupled at one end to the other end of the resistive element R and, at the other end, to ground GND. The switch Sw is coupled at a first terminal to the reference voltage Vr and, at a second terminal, to the control signal Cs via the control signal terminal G. The constant-current source Is is coupled at one end to a third terminal of the switch Sw and, at the other end, to the ground GND.

The switch Sw is controlled by the control signal Cs inputted via the control signal terminal G. To be specific, when the control signal Cs is inputted, the switch Sw couples the first terminal and the third terminal. When the control signal Cs is not inputted, the switch Sw does not couple the first terminal and the third terminal.

The voltage Vs of the received signal Rs outputted from the detector 125 is inputted to the received signal voltage terminal Vip. The control signal Cs outputted from the pulse width detection unit 128 is inputted to the control terminal G. The voltage held by the capacitive element C is outputted as the reference voltage Vr via the reference voltage terminal Vrp.

When a standard received signal Rss is inputted to the detector 125, the voltage Vss of the standard received signal Rss is outputted from the detector 125 and is inputted to the reference voltage setting unit 127 via the received signal voltage terminal Vip. When the voltage Vss of the standard received signal Rss is lower than the predetermined threshold, the voltage is determined to be low. When the voltage Vss of the standard received signal Rss is equal to or higher than the predetermined threshold, the voltage is determined to be high. Namely, the voltage Vss of the standard received signal Rss varies between the two states, low and high.

Hence, the voltage Vss of the standard received signal Rss inputted via the received signal voltage terminal Vip is integrated by the resistive element R and the capacitive element C. A voltage equivalent to an intermediate (average) value of low voltages and high voltages is held by the capacitive element C and the voltage is outputted from the voltage terminal Vrp.

When, in the above state, a control signal Cs outputted from the pulse width detection unit 128 is inputted to the control signal terminal G, the first terminal and the third terminal are coupled in the switch Sw, so that the constant-current source Is lets current flow to the capacitive element C via the switch Sw. This increases the electric charges held by the capacitive element C and raises the reference voltage Vr outputted from the reference voltage terminal Vrp.

Note that there are cases in which a resistive element is referred to as a resistor and a capacitive element is referred to as a capacitor. Also, "low" may be represented by "0" and "high" may be represented by "1".

A concrete example of the pulse width detection unit 128 will be described in the following.

Figure 4:
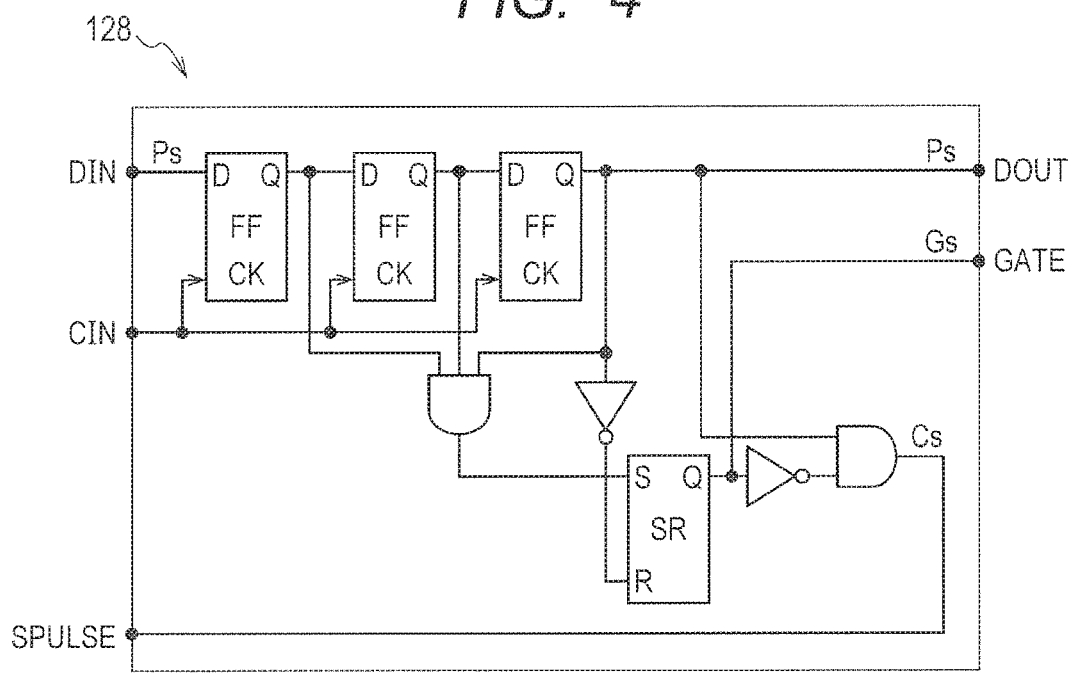
FIG. 4 is a circuit diagram illustrating a pulse width detection unit of the first embodiment.

FIG. 4 is a circuit diagram illustrating the pulse width detection unit of the first embodiment.

As shown in FIG. 4, the pulse width detection unit 128 of the first embodiment includes flip-flops FF, a set/reset latch SR, a pulse signal terminal DIN, a clock terminal CIN, a pulse signal terminal DOUT, a gate terminal GATE and a control signal terminal SPULSE.

A pulse signal Ps outputted from the voltage comparison unit 126 is inputted to the flip-flops FF via the pulse signal terminal DIN. A clock for the flip-flops FF is inputted to the clock terminal CIN. The input of the set/reset latch SR is coupled to the output of the flip-flops FF. When the pulse width Pw of the pulse signal Ps is smaller than the predetermined width Wh, the set/reset latch SR outputs a control signal Cs via the control signal terminal SPULSE. When the pulse width Pw of the pulse signal Ps is equal to or larger than the predetermined width Wh, the set/reset latch SR outputs no control signal Cs.

The operation of the pulse width detection unit 128 will be described below based on an example case in which a clock is inputted to the clock terminal CIN with the clock having a pulse width Pw which is one-third the minimum pulse width Pwm of the standard received signals Rss.

In this case, when the pulse width Pw of a pulse signal Ps inputted to the pulse signal terminal DIN is equal to or larger than three times the pulse width of the clock, the set/reset latch SR is reset and no control signal Cs is outputted from the control signal terminal SPULSE. Also, the pulse signal Ps inputted from the pulse signal terminal DIN is outputted from the pulse signal terminal DOUT. Also, the gate signal Gs is outputted via the gate terminal GATE. The output control unit 129 to which the pulse signal Ps and the gate signal Gs are inputted outputs the pulse signal Ps as a digital signal Ds.

When, in the above case, the pulse width Pw of the pulse signal Ps inputted to the pulse signal terminal DIN is smaller than three times the pulse width of the clock, the set/reset latch SR is set and a control signal Cs is outputted from the control signal terminal SPULSE. The output control unit 129 to which the pulse signal Ps and the gate signal Gs are inputted does not output the pulse signal Ps (digital signal Ds).

Comparison Example

Figure 5:
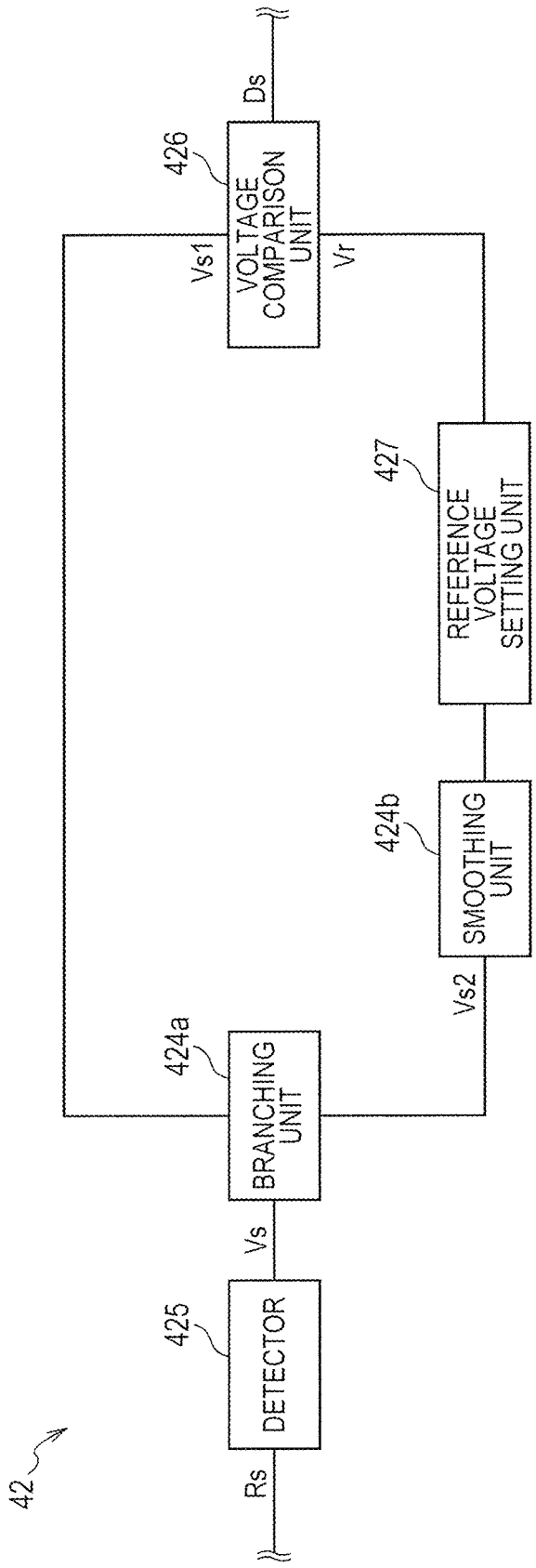
FIG. 5 is a block diagram illustrating a receiving circuit for comparison regarding the first embodiment.

FIG. 5 is a block diagram illustrating a receiving circuit for comparison regarding the first embodiment.

In FIG. 5, a part of a receiving circuit 42 is omitted to simplify description.

As shown in FIG. 5, the receiving circuit 42 for comparison differs from the receiving circuit 12 of the first embodiment mainly in that the receiving circuit 42 for comparison does not include the pulse width detection unit 128 and the output control unit 129.

A detector 425 detects a received signal Rs and outputs voltage Vs of the received signal Rs. A branching unit 424a branches the voltage Vs of the received signal Rs. One, voltage Vs1, of the voltages resulting from branching is inputted to a voltage comparison unit 426. The other, voltage Vs2, of the voltages resulting from branching is inputted to a smoothing unit 424b. The smoothing unit 424b smooths the voltage Vs2, i.e. the other of the voltages resulting from branching, and inputs the smoothed voltage to a reference voltage setting unit 427. The reference voltage setting unit 427 averages the voltage Vs2 inputted from the smoothing unit 424b and inputs the averaged voltage as a reference voltage Vr to the voltage comparison unit 426. The voltage comparison unit 426 compares the voltage Vs1 and the average of the voltage Vs2 and outputs a digital signal Ds.

In the receiving circuit 42 for comparison, when the received signal Rs is not inputted (no signal), random noise voltage is outputted from the detector 425 and the random noise voltage is branched at the branching unit 424a. One of the voltages resulting from branching is inputted to the voltage comparison unit 426. The other of the voltages resulting from branching is inputted, as a reference voltage Vr, to the voltage comparison unit 426 via the smoothing unit 424b and the reference voltage setting unit 427. The voltage comparison unit 426 compares the random noise voltage and the average of the random noise voltage inputted from the smoothing unit 424b. This causes the voltage comparison unit 426 to output, in a no-signal state, the random noise as a digital signal Ds.

Namely, even when noise is inputted to the receiving circuit 42, the receiving circuit 42 outputs the digital signal Ds, so that it is difficult to reduce the effect of noise.

Thus, it is difficult to provide a receiving circuit and a system which can reduce the effect of noise.

Also, every time a digital signal Ds is outputted, a signal processing unit, not shown, is activated causing power consumption, so that reducing power consumption is difficult.

Second Embodiment

Figure 6:
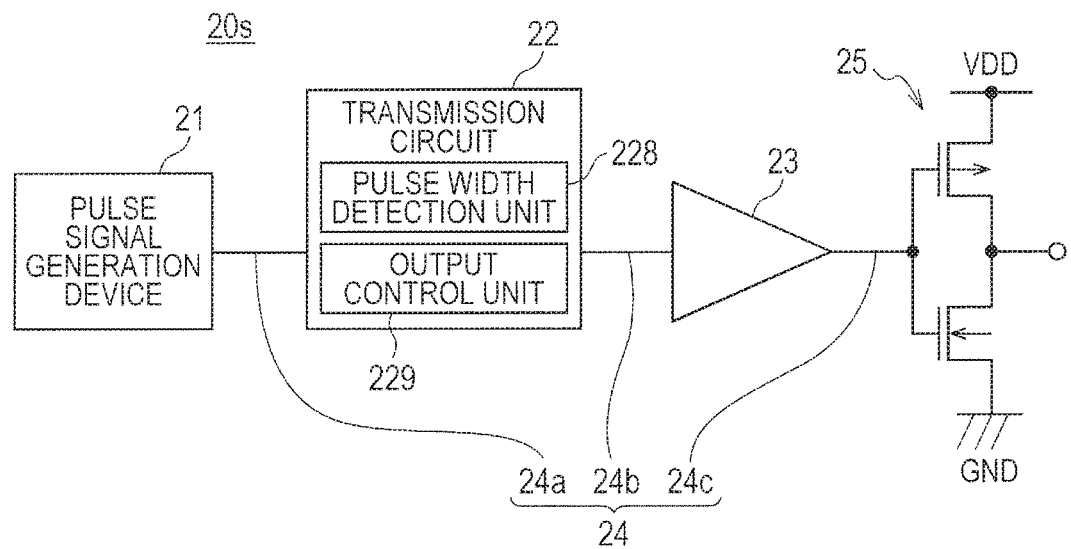
FIG. 6 is a block diagram illustrating a transmission system according to a second embodiment of the present invention.

FIG. 6 is a block diagram illustrating a transmission system according to a second embodiment of the present invention.

As shown in FIG. 6, a transmission system 20s of the second embodiment includes a pulse signal generation device 21, a transmission circuit 22, a pre-driver 23 and a gate drive circuit 25. The pulse signal generation device 21 and the transmission circuit 22 are coupled to each other with a line 24a. The transmission circuit 22 and the pre-driver 23 are coupled to each other with a line 24b. The pre-driver 23 and the gate drive circuit 25 are coupled to each other with a line 24c. The lines 24a, 24b and 24c are generically referred to as a line 24.

The pulse signal generation device 21 generates pulse signals Ps. The transmission circuit 22 includes a pulse width detection unit 228 and an output control unit 229. The transmission circuit 22 transmits the pulse signals Ps generated at the pulse signal generation device 21 to the pre-driver 23 via the line 24. The gate drive circuit 25 operates based on the transmitted pulse signals Ps. The pulse signal generation device is configured, for example, with an MPU (Micro Control Unit). The pulse signals Ps are, for example, PWM-ed (pulse-width-modulated) signals.

In the transmission system 20s, the pulse signals Ps (digital PWM signals) generated at the pulse signal generation device 21 are applied to the gate of the gate drive circuit 25 and a pseudo sinusoidal-like output is generated based on the duty ratios of the pulse signals Ps.

However, when a large operating current is used, noise generated during operation is received and the control based on the pulse signal duty ratios is undesirably affected. The undesirable effects may appear, for example, as vibration and heat generation.

Hence, in the transmission system 20s of the second embodiment, the pulse width detection unit 228 included in the transmission circuit 22 determines whether or not the pulse widths Pw of the pulse signals Ps are smaller than the predetermined width Wh. When the pulse width Pw of a pulse signal Ps is smaller than the predetermined width Wh, the output control unit 229 does not output the pulse signal Ps. When the pulse width Pw is equal to or larger than the predetermined width Wh, the output control unit 229 outputs the pulse signal Ps. Since the transmission circuit 22 does not output pulse signals Ps with short pulse widths, the transmission circuit 22 is sometimes referred to as a short-pulse filter.

In cases where the line 24 used to transmit pulse signals Ps from the pulse signal generation device 21 to the pre-driver 23 is relatively long, the line 24 collects noise. This causes noise to be carried along the line 24, for example, as pulse signals Ps with short pulse widths. When the line 24 carries noise, the pre-driver 23 is caused to make errors and operate at undesired timing.

When the pulse width Pw of a pulse signal Ps is smaller than the predetermined width Wh, the transmission circuit 22 of the second embodiment does not output the pulse signal Ps. In this way, when noise rides on the line 24a coupling the pulse signal generation device 21 and the transmission circuit 22, pulse signals Ps with short pulse widths attributable to the noise (corresponding to the noise) are not outputted. Namely, the transmission circuit 22 has a function to remove noise carried by the line 24a.

Thus, a transmission circuit capable of reducing the effect of noise can be provided.

Since the transmission circuit 22 does not output the pulse signals Ps with short pulse widths attributable to noise, operation at undesired timing (erroneous operation) of the pre-driver 23 in the succeeding stage of the transmission circuit 22 is inhibited. This inhibits flowing of unnecessary current through the gate drive circuit 25, so that the power consumption of the gate drive circuit 25 can be reduced.

Also, in the second embodiment, it is not necessary to shorten the line length between the pulse signal generation device 21 and the pre-driver 23 so as to be less affected by noise. This increases positioning flexibility for the pulse signal generation device 21 and the pre-driver 23.

A concrete example of the transmission circuit 22 will be described below.

Figure 7:
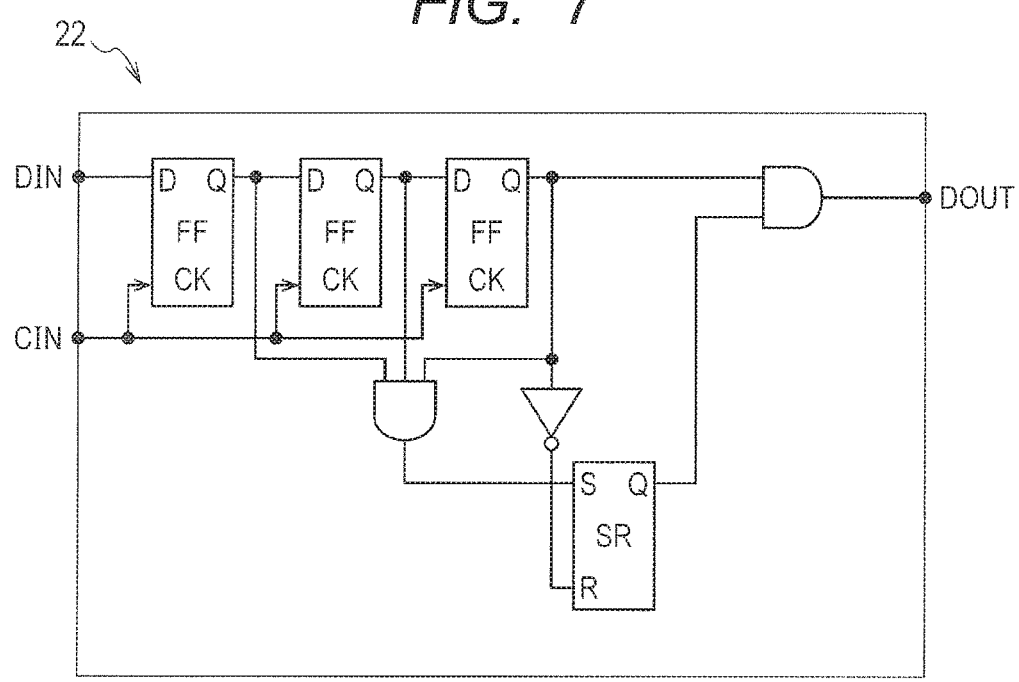
FIG. 7 is a circuit diagram illustrating a transmission circuit of the second embodiment.

FIG. 7 is a circuit diagram illustrating the transmission circuit of the second embodiment.

Referring to FIG. 7, the operation of the transmission circuit 22 will be described below based on an example case in which a clock with a pulse width Pw equaling one third of a time change step (time resolution) of a proper pulse signal Ps is inputted to the clock terminal CIN of the transmission circuit 22 of the second embodiment.

When, as in the above case, the pulse width Pw of a pulse signal Ps inputted to the pulse signal terminal DIN is smaller than three times the clock pulse width, the set/reset latch SR is reset and the pulse signal Ps is not outputted from the pulse signal terminal DOUT.

The invention made by the present inventors has been specifically described based on embodiments, but the invention is not limited to the above embodiments and can be modified in various ways without departing from the scope of the invention.

Parts or whole of the foregoing embodiments can also be described as in, without being limited to, the following additional notes.

Additional Note 1

A receiving circuit including: a voltage comparison unit which compares a voltage of a received signal after detection and a reference voltage and outputs a pulse signal; a reference voltage setting unit which, when the pulse width of the pulse signal is smaller than a predetermined width, sets the reference voltage to be equal to or higher than the predetermined voltage and, when the pulse width of the pulse signal is equal to or larger than the predetermined width, sets the reference voltage to be lower than the predetermined voltage; and an output control unit which, when the pulse width is smaller than the predetermined width, does not output the pulse signal and, when the pulse width is equal to or larger than the predetermined width, outputs the pulse signal.

Additional Note 2

The receiving circuit according to Additional Note 1 further including a pulse width detection unit which determines whether or not the pulse width is smaller than the predetermined width.

Additional Note 3

The receiving circuit according to Additional Note 1 in which the voltage comparison unit outputs the pulse signal, when the voltage of the received signal is equal to or higher than the reference voltage, in a high state or, when the voltage of the received signal is lower than the reference voltage, in a low state.

Additional Note 4

The receiving circuit according to Additional Note 1 in which the received signal is converted into a voltage of the received signal using a detector for detecting the received signal.

Additional Note 5

The receiving circuit according to Additional Note 1 in which the received signal is an FSK (frequency shift keying) modulated signal.

Additional Note 6

The receiving circuit according to Additional Note 1 that, when the pulse width is smaller than the predetermined width, sets the receiving device including the receiving circuit into an inactive state.

Additional Note 7

The receiving circuit according to Additional Note 6 that, when the pulse width is equal to or larger than the predetermined width with the receiving device being in the inactive state, sets the receiving device into an active state.

Additional Note 8

The receiving circuit according to Additional Note 1, in which the predetermined width is a minimum pulse width of the received signal.

Additional Note 9

The receiving circuit according to Additional Note 2: in which the pulse width detection unit, when the pulse width is smaller than the predetermined width, outputs a control signal and, when the pulse width is equal to or larger than the predetermined width, outputs no control signal; in which the reference voltage setting unit, when the control signal is inputted, sets the reference voltage to be equal to or higher than the predetermined voltage and, when the control signal is not inputted, sets the reference voltage to be lower than the predetermined voltage; and in which the output control unit, when the control signal is inputted, does not output the pulse signal and, when the control signal is not inputted, outputs the pulse signal.

Additional Note 10

The receiving circuit according to Additional Note 9 in which the reference voltage setting unit comprises: a resistive element with one end coupled to a voltage of the received signal and the other end coupled to the reference voltage; a capacitive element with one end coupled to the other end of the resistive element and the other end coupled to ground; a switch with a first terminal coupled to the reference voltage and a second terminal coupled to the control signal; and a current source with one end coupled to a third terminal of the switch and the other end coupled to the ground and in which the switch couples the first terminal and the third terminal when the control signal is inputted and does not couple the first terminal and the third terminal when the control signal is not inputted.

Additional Note 11

The receiving circuit according to Additional Note 9 in which the pulse width detection unit comprises a flip-flop to which the pulse signal is inputted and a set/reset latch coupled to the flip-flop, the set/reset latch outputting the control signal when the pulse width is smaller than the predetermined width and not outputting the control signal when the pulse width is equal to or larger than the predetermined width.

Additional Note 12

A transmission circuit for transmitting a pulse signal generated by a pulse signal generation device to a gate drive circuit which is driven based on the pulse signal, the transmission circuit including a pulse width detection unit which determines whether or not the pulse width of the pulse signal is smaller than a predetermined width and an output control unit which, when the pulse width is smaller than the predetermined width, does not output the pulse signal and, when the pulse width is equal to or larger than the predetermined width, outputs the pulse signal.

Additional Note 13

A system including a receiving device having a receiving circuit and a terminal device to communicate with the receiving device in which the terminal device includes a transmission unit to remotely operate the receiving device and in which the receiving circuit includes: a voltage comparison unit which compares a voltage of a received signal after detection and a reference voltage and outputs a pulse signal; a reference voltage setting unit which, when the pulse width of the pulse signal is smaller than a predetermined width, sets the reference voltage to be equal to or higher than a predetermined voltage and, when the pulse width is equal to or larger than the predetermined width, sets the reference voltage to be lower than the predetermined voltage; and an output control unit which, when the pulse width is smaller than the predetermined width, does not output the pulse signal and, when the pulse width is equal to or larger than the predetermined width, outputs the pulse signal.

Additional Note 14

The system according to Additional Note 13 in which the receiving circuit further includes a pulse width detection unit which determines whether or not the pulse width is smaller than the predetermined width.

Additional Note 15

A method including the steps of: comparing the voltage of a received signal after detection and a reference voltage and outputting a pulse signal; setting the reference voltage, when the pulse width of the pulse signal is smaller than a predetermined width, to be equal to or higher than a predetermined voltage and, when the pulse width of the pulse signal is equal to or larger than the predetermined width, to be smaller than the predetermined voltage; and not outputting the pulse signal when the pulse width is smaller than the predetermined width and outputting the pulse signal when the pulse width is equal to or larger than the predetermined width.

Additional Note 16

A program to cause a computer to execute the steps of: comparing the voltage of a received signal after detection and a reference voltage and outputting a pulse signal; setting the reference voltage, when the pulse width of the pulse signal is smaller than a predetermined width, to be equal to or higher than a predetermined voltage and, when the pulse width of the pulse signal is equal to or larger than the predetermined width, to be smaller than the predetermined voltage; and not outputting the pulse signal when the pulse width is smaller than the predetermined width and outputting the pulse signal when the pulse width is equal to or larger than the predetermined width.

What is claimed is:

1. A receiving circuit comprising:
   a voltage comparison unit which compares a voltage of a received signal after detection and a reference voltage and outputs a pulse signal;
   a reference voltage setting unit which, when a pulse width of the pulse signal is smaller than a predetermined width, sets the reference voltage to be equal to or higher than a predetermined voltage and, when the pulse width of the pulse signal is equal to or larger than the predetermined width, sets the reference voltage to be lower than the predetermined voltage; and
   an output control unit which, when the pulse width is smaller than the predetermined width, does not output the pulse signal and, when the pulse width is equal to or larger than the predetermined width, outputs the pulse signal.

2. The receiving circuit according to claim 1, further comprising a pulse width detection unit which determines whether or not the pulse width is smaller than the predetermined width.

3. The receiving circuit according to claim 1, wherein the voltage comparison unit outputs the pulse signal, when the voltage of the received signal is equal to or higher than the reference voltage, in a high state or, when the voltage of the received signal is lower than the reference voltage, in a low state.

4. The receiving circuit according to claim 1, wherein the received signal is converted into a voltage of the received signal using a detector for detecting the received signal.

5. The receiving circuit according to claim 1, wherein the received signal is an FSK (frequency shift keying) modulated signal.

6. The receiving circuit according to claim 1, wherein the receiving circuit, when the pulse width is smaller than the predetermined width, sets a receiving device including the receiving circuit into an inactive state.

7. The receiving circuit according to claim 6, wherein the receiving circuit, when the pulse width is equal to or larger than the predetermined width with the receiving device being in the inactive state, sets the receiving device into an active state.

8. The receiving circuit according to claim 1, wherein the predetermined width is a minimum pulse width of the received signal.

9. The receiving circuit according to claim 2:
wherein the pulse width detection unit, when the pulse width is smaller than the predetermined width, outputs a control signal and, when the pulse width is equal to or larger than the predetermined width, outputs no control signal;
wherein the reference voltage setting unit, when the control signal is inputted, sets the reference voltage to be equal to or higher than the predetermined voltage and, when the control signal is not inputted, sets the reference voltage to be lower than the predetermined voltage; and
wherein the output control unit, when the control signal is inputted, does not output the pulse signal and, when the control signal is not inputted, outputs the pulse signal.

10. The receiving circuit according to claim 9,
wherein the reference voltage setting unit comprises:
a resistive element with one end coupled to a voltage of the received signal and the other end coupled to the reference voltage;
a capacitive element with one end coupled to the other end of the resistive element and the other end coupled to ground;
a switch with a first terminal coupled to the reference voltage and a second terminal coupled to the control signal; and
a current source with one end coupled to a third terminal of the switch and the other end coupled to the ground, and
wherein the switch couples the first terminal and the third terminal when the control signal is inputted and does not couple the first terminal and the third terminal when the control signal is not inputted.

11. The receiving circuit according to claim 9,
wherein the pulse width detection unit comprises:
a flip-flop to which the pulse signal is inputted; and
a set/reset latch coupled to the flip-flop, the set/reset latch outputting the control signal when the pulse width is smaller than the predetermined width and not outputting the control signal when the pulse width is equal to or larger than the predetermined width.

12. A system comprising:
a receiving device having a receiving circuit; and
a terminal device to communicate with the receiving device,
wherein the terminal device includes a transmission unit to remotely operate the receiving device, and
wherein the receiving circuit includes:
a voltage comparison unit which compares a voltage of a received signal after detection and a reference voltage and outputs a pulse signal;
a reference voltage setting unit which, when a pulse width of the pulse signal is smaller than a predetermined width, sets the reference voltage to be equal to or higher than a predetermined voltage and, when the pulse width is equal to or larger than the predetermined width, sets the reference voltage to be lower than the predetermined voltage; and
an output control unit which, when the pulse width is smaller than the predetermined width, does not output the pulse signal and, when the pulse width is equal to or larger than the predetermined width, outputs the pulse signal.

13. The system according to claim 12, wherein the receiving circuit further comprises a pulse width detection unit which determines whether or not the pulse width is smaller than the predetermined width.

* * * * *